(12) United States Patent
Zeng et al.

(10) Patent No.: US 10,529,944 B2
(45) Date of Patent: Jan. 7, 2020

(54) ORGANIC LIGHT-EMITTING DIODE DISPLAY WITH SPACED APART CATHODE LINES

(71) Applicant: Shenzhen China Star Optoelectronics Semiconductor Display Technology Co., Ltd., Guangdong (CN)

(72) Inventors: Weijing Zeng, Guangdong (CN); Baixiang Han, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 109 days.

(21) Appl. No.: 15/577,247

(22) PCT Filed: Oct. 26, 2017

(86) PCT No.: PCT/CN2017/107828
§ 371 (c)(1),
(2) Date: Nov. 27, 2017

(87) PCT Pub. No.: WO2019/033554
PCT Pub. Date: Feb. 21, 2019

(65) Prior Publication Data
US 2019/0058151 A1 Feb. 21, 2019

(30) Foreign Application Priority Data
Aug. 16, 2017 (CN) .......................... 2017 1 0699528

(51) Int. Cl.
*H01L 29/00* (2006.01)
*H01L 33/00* (2010.01)
(Continued)

(52) U.S. Cl.
CPC ...... *H01L 51/5221* (2013.01); *H01L 27/3211* (2013.01); *H01L 27/3213* (2013.01);
(Continued)

(58) Field of Classification Search
CPC ............ H01L 51/5036; H01L 51/5203; H01L 51/5206; H01L 27/3211; H01L 27/3213; H01L 27/3276
See application file for complete search history.

(56) References Cited

U.S. PATENT DOCUMENTS

2002/0011976 A1    1/2002  Hashimoto
2004/0021761 A1*   2/2004  Gaudiana .................. B41J 2/45
                                                       347/130
(Continued)

FOREIGN PATENT DOCUMENTS

CN          1645445 A       7/2005
CN        102081903 A       6/2011
(Continued)

*Primary Examiner* — Alonzo Chambliss
(74) *Attorney, Agent, or Firm* — Muncy, Geissler, Olds & Lowe, P.C.

(57) ABSTRACT

An organic light-emitting diode display is provided. The organic light-emitting diode display has an anode layer, an organic layer disposed on the anode layer, and a cathode layer disposed on the organic layer and comprising a plurality of cathode lines. The organic light-emitting diode display comprises a plurality of pixel columns corresponding to the cathode lines. Pixels in the same pixel column have the same color, and the cathode lines corresponding to the pixel columns having different colors are inputted with different cathode voltages, respectively.

14 Claims, 2 Drawing Sheets

(51) Int. Cl.
  *H01L 31/0232* (2014.01)
  *H01L 21/00* (2006.01)
  *H01L 51/40* (2006.01)
  *H01L 51/52* (2006.01)
  *H01L 27/32* (2006.01)
  *H01L 51/50* (2006.01)
(52) U.S. Cl.
  CPC ...... *H01L 27/3276* (2013.01); *H01L 51/5036* (2013.01); *H01L 51/5206* (2013.01); *H01L 2251/5307* (2013.01)

(56) References Cited

U.S. PATENT DOCUMENTS

| | | | |
|---|---|---|---|
| 2004/0095300 A1* | 5/2004 | So | G09G 3/3216 345/82 |
| 2010/0277449 A1 | 11/2010 | Kanda | |
| 2011/0128268 A1* | 6/2011 | Kim | G09G 3/3225 345/211 |
| 2012/0007496 A1* | 1/2012 | Maruyama | H01L 51/5203 313/504 |
| 2012/0139959 A1 | 6/2012 | Kim | |
| 2014/0299867 A1* | 10/2014 | Ono | H01L 51/5228 257/40 |

FOREIGN PATENT DOCUMENTS

| | | |
|---|---|---|
| CN | 102486910 A | 6/2012 |
| CN | 106449705 A | 2/2017 |
| JP | 2004226543 A | 8/2004 |

* cited by examiner

ORGANIC LIGHT-EMITTING DIODE DISPLAY WITH SPACED APART CATHODE LINES

FIELD OF INVENTION

The present disclosure relates to a technical field of displays, and in particular to an organic light-emitting diode display.

BACKGROUND OF INVENTION

Organic Light-Emitting Diode (OLED) display panels have some features, such as being self-luminous, high brightness, wide viewing angles, high contrast, being flexible, and having low power consumption. Therefore, they are widely used in mobile phone screens, computer monitors, and full color TVs. OLED display panels comprise self-emitting OLED elements, wherein organic light-emitting diodes are current-driven components. Brightness of the panels are driven by current passing through OLED components. OLED cathodes are easily affected by voltage drop (IR drop) so that the current passing through the OLED elements is reduced and affects the display brightness. When the current is greater, the brightness decreases more.

Adjusting gamma of the panel brightness collects the brightness in different colors and different grayscale voltages, then division of the corresponding grayscale is processed. The division of the grayscale having different colors is determined by IR drop of the corresponding color pixel. However, as shown in FIG. 1, a cathode layer 11 of OLED panel is a layered structure, wherein the cathode layer 11 is inputted the same cathode voltage VSS, and all pixels are connected to a common cathode so that the brightness of the pixel will be affected by the current of the panel and IR drop, and IR drop of the panels are the same. Thus, a difference is generated between actual gamma adjustment and panel brightness so that the panel has color cast.

As a result, it is necessary to provide an organic light-emitting diode display to solve the problems existing in conventional technologies, as described above.

SUMMARY OF INVENTION

An object of the present disclosure is to provide an organic light-emitting diode display which can avoid color cast appearing in the display.

To achieve the above objects, the present disclosure provides an organic light-emitting diode display, wherein the organic light-emitting diode display comprises: an anode layer; an organic layer disposed on the anode layer; and a cathode layer disposed on the organic layer and comprising a plurality of cathode lines spaced apart from each other, wherein the organic light-emitting diode display comprises a plurality of pixel columns corresponding to the cathode lines. Pixels in the same pixel column have the same color, the cathode lines corresponding to the pixel columns having different colors are inputted with different cathode voltages, respectively. The organic light-emitting diode display further comprises a voltage supply module configured to supply cathode voltages, and the cathode lines connect to the voltage supply module.

In one embodiment of the present disclosure, an end of the cathode lines connects to the voltage supply module.

In one embodiment of the present disclosure, two ends of the cathode lines connect to the voltage supply module.

In one embodiment of the present disclosure, the voltage supply module comprises a first voltage supply unit configured to supply a first cathode voltage, a second voltage supply unit configured to supply a second cathode voltage, and a third voltage supply unit configured to supply a third cathode voltage. The pixel columns comprises a red pixel column, a green pixel column, and a blue pixel column, wherein the cathode line corresponding to the red pixel column connects to the first voltage supply unit, the cathode line corresponding to the green pixel column connects to the second voltage supply unit, and the cathode line corresponding to the blue pixel column connects to the third voltage supply unit.

In one embodiment of the present disclosure, the cathode lines are formed by an evaporation process.

In one embodiment of the present disclosure, the organic light-emitting diode display further comprises a switch array layer located under the anode layer, and the switch array layer comprises a plurality of switch elements.

In one embodiment of the present disclosure, the organic light-emitting diode display further comprises an encapsulation layer located on the cathode layer.

In one embodiment of the present disclosure, the organic light-emitting diode display is a top emission type or a bottom emission type.

To achieve the above objects, the present disclosure provides an anode layer; an organic layer disposed on the anode layer; and a cathode layer disposed on the organic layer and comprising a plurality of cathode lines, wherein the organic light-emitting diode display comprises a plurality of pixel columns corresponding to the cathode lines. Pixels in the same pixel column have the same color, the cathode lines corresponding to the pixel columns having different colors are inputted with different cathode voltages, respectively.

In one embodiment of the present disclosure, the organic light-emitting diode display further comprises a voltage supply module configured to supply cathode voltages, and the cathode lines connect to the voltage supply module.

In one embodiment of the present disclosure, an end of the cathode lines connects to the voltage supply module.

In one embodiment of the present disclosure, two ends of the cathode lines connect to the voltage supply module.

In one embodiment of the present disclosure, the voltage supply module comprises a first voltage supply unit configured to supply a first cathode voltage, a second voltage supply unit configured to supply a second cathode voltage, and a third voltage supply unit configured to supply a third cathode voltage. The pixel columns comprises a red pixel column, a green pixel column, and a blue pixel column, wherein the cathode line corresponding to the red pixel column connects to the first voltage supply unit, the cathode line corresponding to the green pixel column connects to the second voltage supply unit, and the cathode line corresponding to the blue pixel column connects to the third voltage supply unit.

In one embodiment of the present disclosure, the cathode lines are spaced apart from each other.

In one embodiment of the present disclosure, the cathode lines are formed by an evaporation process.

In one embodiment of the present disclosure, the organic light-emitting diode display further comprises a switch array layer located under the anode layer, and the switch array layer comprises a plurality of switch elements.

In one embodiment of the present disclosure, the organic light-emitting diode display further comprises an encapsulation layer located on the cathode layer.

In one embodiment of the present disclosure, the organic light-emitting diode display is a top emission type or a bottom emission type.

In the organic light-emitting diode display of the present disclosure, the cathode layer is divided with a plurality of cathode lines, and the cathode lines corresponding to the pixel columns having different colors are inputted with different cathode voltages so that the panel brightness can be adjusted, and color cast can be avoided.

DETAILED DESCRIPTION OF PREFERRED EMBODIMENTS

The structure and the technical means adopted by the present invention to achieve the above and other objects can be best understood by referring to the following detailed description of the preferred embodiments and the accompanying drawings. Furthermore, directional terms described by the present invention, such as upper, lower, front, back, left, right, inner, outer, side, longitudinal/vertical, transverse/horizontal, etc., are only directions by referring to the accompanying drawings, and thus the used directional terms are used to describe and understand the present invention, but the present invention is not limited thereto.

In an embodiment, an organic light-emitting diode display of the present disclosure comprises a plurality of pixel columns, pixels in the same pixel column have the same color, wherein the pixel columns comprises a red pixel column, a green pixel column, and a blue pixel column.

In the cross-sectional structure, the organic light-emitting diode display of the present disclosure comprises an anode layer 101, an organic layer 102, and a cathode layer 2. The organic layer 102 is disposed on the anode layer 101, and the cathode layer 2 is disposed on the organic layer 102.

Figure 1:
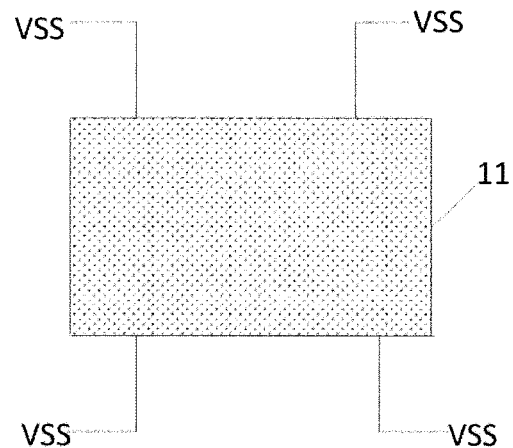
FIG. 1 is a schematic view of a cathode layer of a traditional organic light-emitting diode display.
Figure 2:
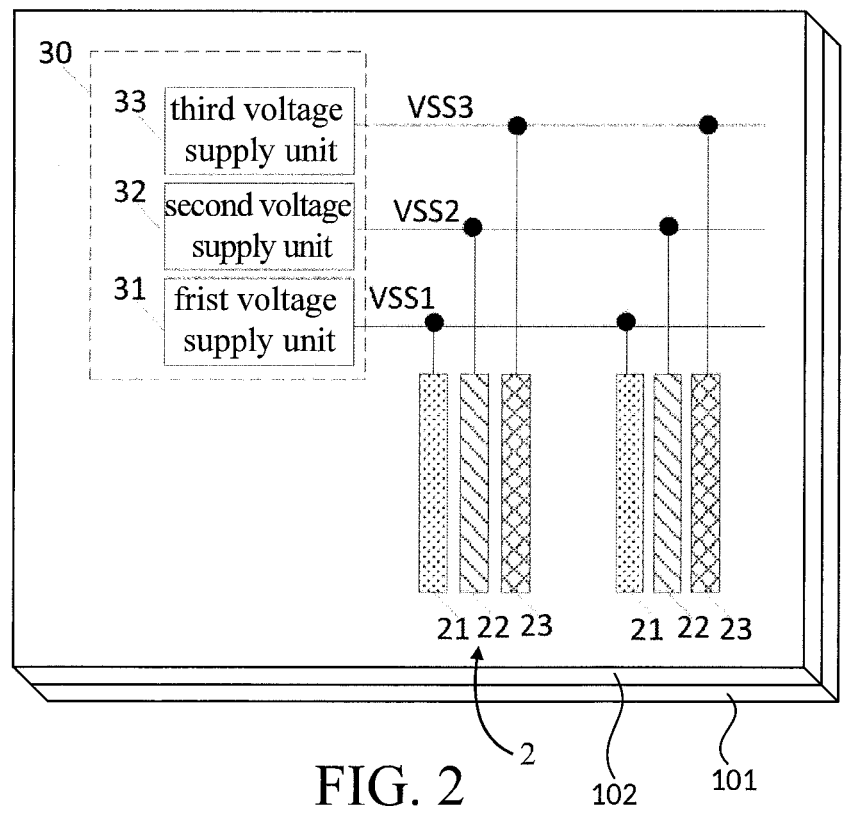
FIG. 2 is a schematic view of a cathode layer of an organic light-emitting diode display according to an embodiment of the present disclosure.

Referring to FIG. 2, the cathode layer 2 comprising a plurality of cathode lines 21-23 spaced apart from each other, the cathode lines 21-23 correspond to the pixel columns, respectively. Each of the pixel columns is disposed with a cathode line, wherein the cathode lines are spaced apart from each other, and two adjacent cathode lines are spaced apart so that cathode voltages can be inputted.

In an embodiment, the cathode line 21 corresponds to the red pixel column, the cathode line 22 corresponds to the green pixel column, and the cathode line 23 corresponds to the blue pixel column. The cathode lines corresponding to the pixel columns having different colors are inputted with different cathode voltages, respectively, such as the cathode line 21 corresponding to the red pixel column is inputted with a first cathode voltage VSS1, the cathode line 22 corresponding to the green pixel column is inputted with a second cathode voltage VSS2, and the cathode line 23 corresponding to the blue pixel column is inputted with a third cathode voltage VSS3.

The cathode lines are formed by a mask evaporation process for cathode material.

The organic light-emitting diode display of the present disclosure further comprises a voltage supply module 30, wherein the voltage supply module 30 is configured to supply cathode voltages. The voltage supply module 30 comprises a first voltage supply unit 31, a second voltage supply unit 32, and a third voltage supply unit 33. The first voltage supply unit 31 is configured to supply the first cathode voltage VSS1, the second voltage supply unit 32 is configured to supply the second cathode voltage VSS2, and the third voltage supply unit 33 is configured to supply the third cathode voltage VSS3.

An end of the cathode lines 21-23 connects to the voltage supply module 30.

For example, an end of the cathode line 21 corresponding to the red pixel column connects to the first voltage supply unit 31 for inputting the first cathode voltage VSS1, an end of the cathode line 22 corresponding to the green pixel column connects to the second voltage supply unit 32 for inputting the second cathode voltage VSS2, and an end of the cathode line 23 corresponding to the blue pixel column connects to the third voltage supply unit 33 for inputting the first cathode voltage VSS3.

The organic light-emitting diode display further comprises a switch array layer, and the switch array layer is located under the anode layer 101, and the switch array layer comprises a plurality of switch elements.

The organic light-emitting diode display further comprises an encapsulation layer, and the encapsulation layer is located on the cathode layer 2.

The organic light-emitting diode display is a top emission type or a bottom emission type.

It is understandable that the pixel columns further comprises at least one of a white pixel column or a yellow pixel column. The cathode lines are not limited to the cathode lines described above.

The cathode layer 2 is divided with a plurality of cathode lines, and the cathode lines corresponding to the pixel columns having different colors are inputted with different cathode voltages VSS so that the collected brightness corresponds to the actual brightness of the panel during adjusting gamma of the panel brightness. Thus, color cast can be avoided.

In another embodiment, the organic light-emitting diode display of the present disclosure comprises a plurality of pixel columns, wherein pixels in the same pixel column have the same color. The pixel columns comprise a red pixel column, a green pixel column, and a blue pixel column. It is understandable that the pixel columns further comprise at least one of a white pixel column or a yellow pixel column.

In the cross-sectional structure, the organic light-emitting diode display of the present disclosure comprises an anode layer 101, an organic layer 102, and a cathode layer 2. The organic layer 102 is disposed on the anode layer 101, and the cathode layer 2 is disposed on the organic layer 102.

Figure 3:
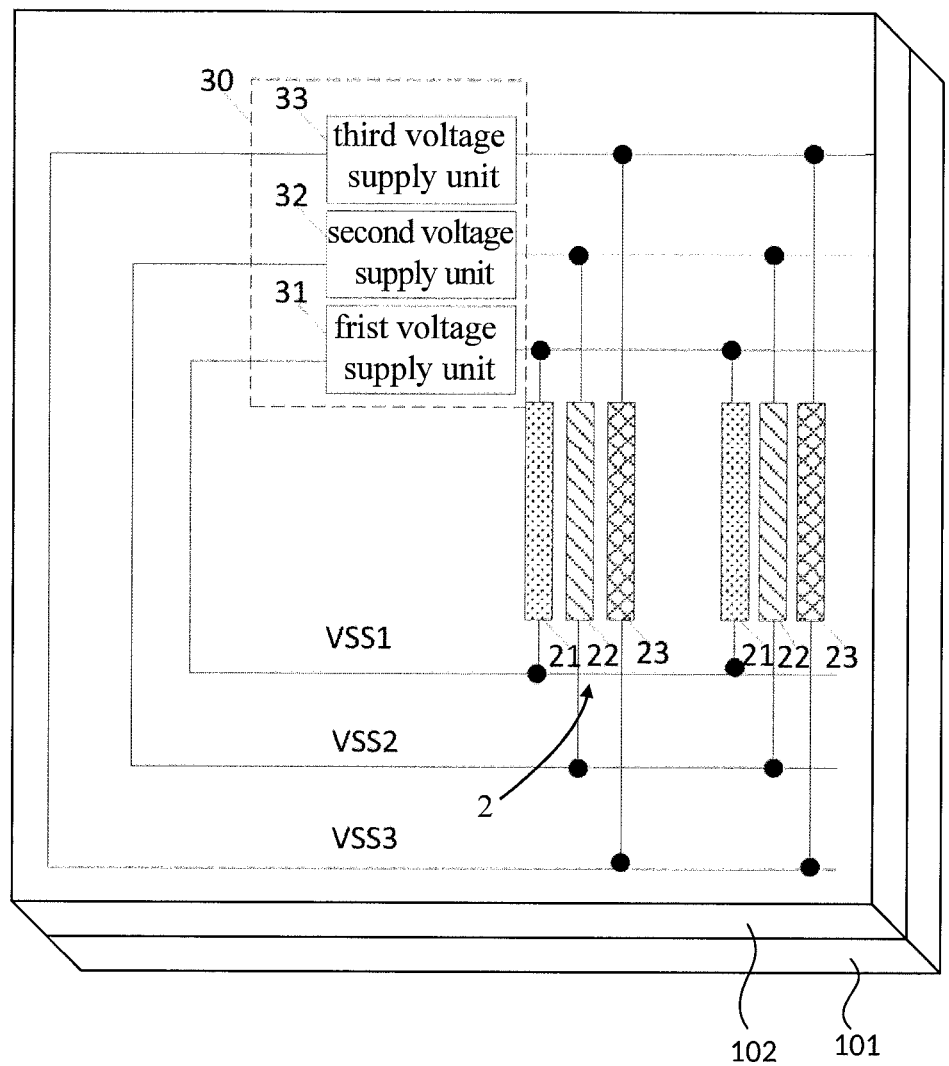
FIG. 3 is a schematic view of a cathode layer of an organic light-emitting diode display according to another embodiment of the present disclosure.

Referring to FIG. 3, the cathode layer 2 comprising a plurality of cathode lines 21-23, and the cathode lines 21-23 correspond to the pixel columns, respectively. Each of the pixel columns is disposed with a cathode line, wherein the cathode lines are spaced apart from each other, and two adjacent cathode lines are spaced apart so that cathode voltages can be inputted.

Specifically, the cathode line 21 corresponds to the red pixel column, the cathode line 22 corresponds to the green pixel column, and the cathode line 23 corresponds to the blue pixel column. The cathode lines corresponding to the pixel columns having different colors are inputted with different cathode voltages, respectively, such as the cathode line 21 corresponding to the red pixel column is inputted with a first cathode voltage VSS1, the cathode line 22 corresponding to the green pixel column is inputted with a second cathode voltage VSS2, and the cathode line 23 corresponding to the blue pixel column is inputted with a third cathode voltage VSS3.

The cathode lines are formed by a mask evaporation process for cathode material.

The organic light-emitting diode display of the present disclosure further comprises a voltage supply module 30, wherein the voltage supply module 30 is configured to supply cathode voltages. The voltage supply module 30 comprises a first voltage supply unit 31, a second voltage supply unit 32, and a third voltage supply unit 33. The first voltage supply unit 31 is configured to supply the first cathode voltage VSS1, the second voltage supply unit 32 is configured to supply the second cathode voltage VSS2, and the third voltage supply unit 33 is configured to supply the third cathode voltage VSS3.

Two ends of the cathode lines 21-23 connect to the voltage supply module 30.

Referring to FIG. 3, two ends of the cathode lines 21-23 connect to the voltage supply module 30, wherein an upper end and a lower end of the cathode line 21 corresponding to the red pixel column connects to the first voltage supply unit 31 for inputting the first cathode voltage VSS1. An upper end and a lower end of the cathode line 22 corresponding to the green pixel column connects to the second voltage supply unit 32 for inputting the second cathode voltage VSS2. An upper end and a lower end of the cathode line 23 corresponding to the blue pixel column connects to the third voltage supply unit 33 for inputting the first cathode voltage VSS3.

The organic light-emitting diode display further comprises a switch array layer, and the switch array layer is located under the anode layer 101, and the switch array layer comprises a plurality of switch elements.

The organic light-emitting diode display further comprises an encapsulation layer, and the encapsulation layer is located on the cathode layer 2.

The organic light-emitting diode display is a top emission type or a bottom emission type.

In the embodiment, the upper end and the lower end of the cathode line are inputted the cathode voltage. Based on above embodiment, voltage drop (IR drop) can be further reduced so that color cast can be avoided better.

In the organic light-emitting diode display of the present disclosure, the cathode layer is divided with a plurality of cathode lines, and the cathode lines corresponding to the pixel columns having different colors are inputted with different cathode voltages VSS so that the panel brightness can be adjusted, and color cast can be avoided.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. An organic light-emitting diode display, comprising:
   an anode layer;
   an organic layer disposed on the anode layer; and
   a cathode layer disposed on the organic layer and comprising a plurality of cathode lines spaced apart from each other, wherein the organic light-emitting diode display comprises a plurality of pixel columns corresponding to the cathode lines;
   wherein pixels in the same pixel column have a same color, the cathode lines corresponding to the pixel columns having different colors are inputted with different cathode voltages, respectively;
   the organic light-emitting diode display further comprises a voltage supply module configured to supply cathode voltages, and the cathode lines connect to the voltage supply module.

2. The organic light-emitting diode display according to claim 1, wherein an end of the cathode lines connects to the voltage supply module.

3. The organic light-emitting diode display according to claim 1, wherein two ends of the cathode lines connect to the voltage supply module.

4. The organic light-emitting diode display according to claim 1, wherein the voltage supply module comprises a first voltage supply unit configured to supply a first cathode voltage, a second voltage supply unit configured to supply a second cathode voltage, and a third voltage supply unit configured to supply a third cathode voltage;
   the pixel columns comprise a red pixel column, a green pixel column, and a blue pixel column, wherein the cathode line corresponding to the red pixel column connects to the first voltage supply unit, the cathode line corresponding to the green pixel column connects to the second voltage supply unit, and the cathode line corresponding to the blue pixel column connects to the third voltage supply unit.

5. The organic light-emitting diode display according to claim 1, wherein the cathode lines are formed by an evaporation process.

6. The organic light-emitting diode display according to claim 1, wherein the organic light-emitting diode display is a top emission type or a bottom emission type.

7. An organic light-emitting diode display, comprising:
   an anode layer;
   an organic layer disposed on the anode layer; and
   a cathode layer disposed on the organic layer and comprising a plurality of cathode lines, wherein the organic light-emitting diode display comprises a plurality of pixel columns corresponding to the cathode lines;
   wherein pixels in the same pixel column have the same color, the cathode lines corresponding to the pixel columns having different colors are inputted with different cathode voltages, respectively.

8. The organic light-emitting diode display according to claim 7, wherein the organic light-emitting diode display further comprises a voltage supply module configured to supply cathode voltages, and the cathode lines connect to the voltage supply module.

9. The organic light-emitting diode display according to claim 8, wherein an end of the cathode lines connects to the voltage supply module.

10. The organic light-emitting diode display according to claim 8, wherein two ends of the cathode lines connect to the voltage supply module.

11. The organic light-emitting diode display according to claim 8, wherein the voltage supply module comprises a first voltage supply unit configured to supply a first cathode voltage, a second voltage supply unit configured to supply a second cathode voltage, and a third voltage supply unit configured to supply a third cathode voltage;
   the pixel columns comprise a red pixel column, a green pixel column, and a blue pixel column, wherein the cathode line corresponding to the red pixel column connects to the first voltage supply unit, the cathode line corresponding to the green pixel column connects to the second voltage supply unit, and the cathode line corresponding to the blue pixel column connects to the third voltage supply unit.

12. The organic light-emitting diode display according to claim 7, wherein the cathode lines are spaced apart from each other.

13. The organic light-emitting diode display according to claim 7, wherein the cathode lines are formed by an evaporation process.

14. The organic light-emitting diode display according to claim 7, wherein the organic light-emitting diode display is a top emission type or a bottom emission type.

* * * * *